(12) United States Patent
Chang et al.

(10) Patent No.: US 10,032,836 B2
(45) Date of Patent: Jul. 24, 2018

(54) ORGANIC LIGHT EMITTING DIODE DISPLAY WITH SPACER ON PIXEL DEFINITION LAYER AND METHOD FOR MANUFACTURING THE SAME

(71) Applicant: Samsung Display Co., Ltd., Yongin-si, Gyeonggi-doKR (KR)

(72) Inventors: Moon Won Chang, Hwaseong-si (KR); Oh June Kwon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/236,341

(22) Filed: Aug. 12, 2016

(65) Prior Publication Data

US 2017/0098688 A1 Apr. 6, 2017

(30) Foreign Application Priority Data

Oct. 2, 2015 (KR) ........................ 10-2015-0139093

(51) Int. Cl.
*H01L 27/32* (2006.01)

(52) U.S. Cl.
CPC ........ *H01L 27/3246* (2013.01); *H01L 27/326* (2013.01); *H01L 27/3258* (2013.01); *H01L 2227/323* (2013.01)

(58) Field of Classification Search
CPC ............. H01L 27/3246; H01L 27/3258; H01L 27/326; H01L 2227/323
See application file for complete search history.

(56) References Cited

U.S. PATENT DOCUMENTS

| 2014/0284572 A1* | 9/2014 | Oooka | H01L 51/525 257/40 |
| 2015/0090982 A1* | 4/2015 | Lin | H01L 51/525 257/40 |
| 2016/0181566 A1* | 6/2016 | Wang | H01L 27/3246 257/40 |
| 2016/0190517 A1* | 6/2016 | Masuda | H01L 51/5259 257/40 |

FOREIGN PATENT DOCUMENTS

| JP | 2015-082411 A | 4/2015 |
| KR | 10-2004-0036823 A | 5/2004 |
| KR | 10-2010-0081773 A | 7/2010 |
| KR | 10-2011-0081522 A | 7/2011 |
| KR | 10-2014-0120427 A | 10/2014 |
| KR | 10-2015-0016777 A | 2/2015 |

* cited by examiner

*Primary Examiner* — Peter Bradford
(74) *Attorney, Agent, or Firm* — Lewis Roca Rothgerber Christie LLP

(57) ABSTRACT

An organic light emitting diode (OLED) display includes a base substrate, a first electrode on the base substrate, a pixel definition layer on the first electrode and having an opening exposing the first electrode, spacers on the pixel definition layer and having a smaller modulus than the pixel definition layer, an organic emission layer on the first electrode to correspond to the opening, and a second electrode on the organic emission layer.

6 Claims, 5 Drawing Sheets

ORGANIC LIGHT EMITTING DIODE DISPLAY WITH SPACER ON PIXEL DEFINITION LAYER AND METHOD FOR MANUFACTURING THE SAME

CROSS-REFERENCE TO RELATED APPLICATION

This application claims priority to and the benefit of Korean Patent Application No. 10-2015-0139093, filed in the Korean Intellectual Property Office on Oct. 2, 2015, the entire content of which is herein incorporated by reference.

BACKGROUND

1. Field

Aspects of embodiments of the present invention relate generally to an organic light emitting diode (OLED) display and a method of manufacturing an OLED display.

2. Description of the Related Art

OLED displays have received much attention as display devices for displaying images. OLED displays have a self-emission characteristic and do not require a separate light source, unlike liquid crystal displays and thus, their thickness and weight may be reduced compared to other display devices. Further, OLED displays have high quality characteristics, such as low power consumption, high luminance, and high response speed. Nevertheless, achieving still higher light emission is an important design goal of OLED displays.

The above information disclosed in this Background section is only for enhancement of understanding of the background of the described technology and therefore it may contain information that does not form the prior art that is already known in this country to a person of ordinary skill in the art.

SUMMARY

Embodiments of the present invention provide for an OLED display and a manufacturing method of an OLED display having improved light emission.

In an embodiment of the present invention, an organic light emitting diode (OLED) display is provided. The OLED display includes a base substrate, a first electrode on the base substrate, a pixel definition layer on the first electrode and having an opening exposing the first electrode, spacers on the pixel definition layer and having a smaller modulus than the pixel definition layer, an organic emission layer on the first electrode to correspond to the opening, and a second electrode on the organic emission layer.

The spacers may have a height of about 0.3 µm to about 1 µm.

The spacers may have a modulus of about 0.8 GPa to about 2.5 GPa.

The spacers may include one of an acryl-based resin and polyimide (PI).

The OLED display may further include an encapsulation substrate on the second electrode and having a surface facing the base substrate, and black matrix on the surface of the encapsulation substrate to correspond to the pixel definition layer.

The black matrix may have a larger modulus than the spacers.

In another embodiment of the present invention, a method of manufacturing an organic light emitting diode (OLED) display is provided. The method includes forming a first electrode on a base substrate, forming a pixel definition layer on the base substrate and having an opening exposing the first electrode, forming spacers of a first height on the pixel definition layer and having a smaller modulus than the pixel definition layer, contacting a pattern mask to the spacers, forming an organic emission layer on the first electrode through an opening pattern of the pattern mask corresponding to the opening in the pixel definition layer, forming a second electrode on the organic emission layer, positioning an encapsulation substrate on the second electrode, and bonding the base substrate to the encapsulation substrate to reduce a height of the spacers from the first height to a second height.

The second height may be about 10% to about 35% of the first height.

The first height may be about 3 µm to about 10 µm.

The second height may be about 0.3 µm to about 1 µm.

A pressure applied in the bonding of the base substrate to the encapsulation substrate may be about 100,325 Pa to about 101,325 Pa.

The encapsulation substrate may further include black matrix on the encapsulation substrate to correspond to the pixel definition layer.

The black matrix may have a larger modulus than the spacers.

According to the above and other embodiments of the present invention, it is possible to provide an OLED display and a manufacturing method of an OLED display having improved light emission.

DETAILED DESCRIPTION

Figure 1:
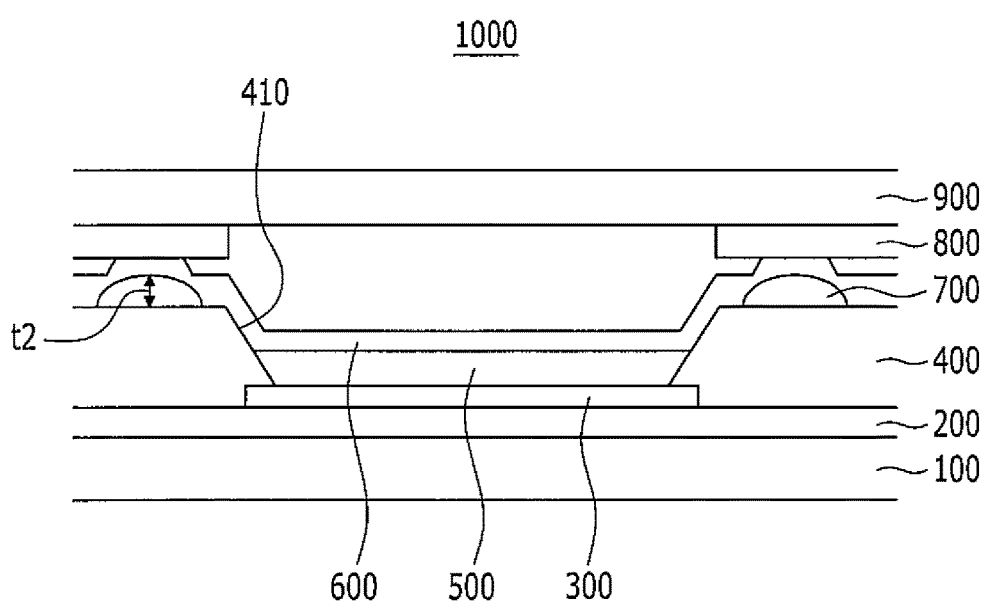
FIG. 1 is a cross-sectional view illustrating an example OLED display according to an embodiment of the present invention.

The present invention will be described more fully hereinafter with reference to the accompanying drawings, in which example embodiments of the invention are shown. However, as those skilled in the art would realize, the described embodiments may be modified in various different ways, all without departing from the spirit or scope of the present invention. To more clearly describe embodiments of the present invention, parts that may be of little or no relevance may be omitted, and like or similar reference numerals refer to like or similar constituent elements throughout the specification.

Further, for ease of description, since like reference numerals may designate like elements having the same or similar configuration, a first embodiment may be representatively described, and in subsequent embodiments, only different configurations from the first embodiment may be described. In addition, since sizes and thicknesses of constituent members shown in the accompanying drawings may be arbitrarily depicted for better understanding and ease of description, the present invention is not limited to the illustrated sizes and thicknesses.

In the drawings, for better understanding and ease of description, the thickness of layers, films, panels, regions, etc., may be exaggerated for clarity. Further, it will be understood that when an element such as a layer, film, region, or substrate is referred to as being "on" another element, it may be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the word "on" may mean positioning on or below the object portion, but does not essentially mean positioning on the upper side of the object portion based on a gravity direction.

In the present specification, the modulus as a value representing mechanical strength may be measured with reference to ISO527, JISK7161, JISK7162, JISK7127, ASTMD638, ASTMD882, etc. Accordingly, when the modulus value is smaller, a smaller force may be required to obtain the same deformation, or when the same force is applied, the deformation may be larger.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

When forming an organic emission layer of an OLED display, numerous spacers may be formed on a base substrate (such as on a pixel definition layer) to serve as points of contact with a deposition mask for depositing organic material. The spacers prevent direct contact of constituent elements formed on the base substrate (other than the spacers themselves) with the deposition mask, and facilitate the depositing of the organic material through the deposition mask to form the organic emission layer.

An encapsulation substrate may be bonded to the base substrate to complete the OLED display. The encapsulation substrate may have black matrix to correspond to the pixel definition layer (and not to the organic emission layer) and that helps with contrast. However, after the encapsulation substrate is bonded to the base substrate to complete the OLED display, the spacers remain on the pixel definition layer, which increases the separation between the pixel definition layer and the encapsulation substrate. This increased separation may cause more of the light emitted from the organic emission layer to be absorbed by the black matrix (which may deteriorate light emission) than would be absorbed if the encapsulation substrate were as close as possible to the pixel definition layer. Accordingly, embodiments of the present invention address this phenomenon, an example embodiment of which will now be described with reference to FIG. 1.

FIG. 1 is a cross-sectional view illustrating an example OLED display 1000 according to an embodiment of the present invention.

As shown in FIG. 1, the OLED display 1000 may include a base substrate 100, a circuit portion 200, a first electrode 300, a pixel definition layer 400, an organic emission layer 500, a second electrode 600, spacers 700, black matrix 800, and an encapsulation substrate 900. In FIG. 1, one pixel of the OLED display 1000 is illustrated by way of example. The OLED display 1000 may include a plurality of pixels. However, for ease of description, the present application may discuss a single pixel, with corresponding extensions to a plurality of pixels being apparent to one of ordinary skill.

The base substrate 100 may be an insulating substrate made of, for example, glass, quartz, ceramic, plastic, or the like. In other embodiments, the base substrate 100 may be a flexible, stretchable, or rollable substrate made of an organic material such as polyimide, polycarbonate, polyethylene, polyethylene terephthalate, or polyacrylate.

The circuit portion 200 may be disposed (for example, formed) on the base substrate 100. The circuit portion 200 may include a plurality of wires including at least a scan line, a data line, a driving power line, a common power line, and the like, and a pixel circuit including at least one capacitor and two or more thin film transistors (TFTs) connected to the wires to correspond to one pixel. The circuit portion 200 may be formed to have various known structures to one of ordinary skill.

The first electrode 300 may be disposed (for example, formed) on the circuit portion 200 and connected to one of the TFTs of the circuit portion 200. The first electrode 300 may be an anode serving as a hole injection electrode, and may have light reflectivity, light transflectivity, or light transmissivity depending on design considerations of the OLED display 1000. For example, the first electrode 300 may include one or more metal oxides such as ITO, IZO, ZnO, and $In_2O_3$. Instead of or in addition to the metal oxides, the first electrode 300 may include one or more metals such as Ag, Mg, Al, Pt, Pd, Au, Ni, Nd, Ir, Cr, Li, Ca, Li, Ca, LiF/Ca, LiF/Al, and alloys thereof. Further, the first electrode 300 may be formed to have a single layer or a multi-layered structure in which a plurality of layers are stacked. In another embodiment, the first electrode 300 may be a cathode serving as an electron injection electrode.

The organic emission layer 500 may emit at least one of red, green, blue, and white light, or the like. When the organic emission layer 500 emits white light, a color filter may be disposed on the light path emitted from the organic emission layer 500 to change the emitted wavelengths of the light.

The pixel definition layer 400 may be disposed (for example, formed) on the circuit portion 200 and the first electrode 300, and may include an opening 410 for exposing a portion of the first electrode 300 at which the organic emission layer 500 is disposed. The pixel definition layer 400 may define a pixel area by surrounding an edge of the first electrode 300. A region of the first electrode 300 that is exposed by the opening 410 of the pixel definition layer 400 may be defined as the pixel area. The pixel definition layer 400 may include, for example, any one or more of polyimide (PI), benzocyclobutene (BCB), polyimide (PA), an epoxy resin, an acryl-based resin, and a phenol resin. For example, the pixel definition layer 400 may include polyimide.

The spacers 700 may be disposed (for example, formed) on the pixel definition layer 400, and may have a narrow area as compared to the pixel definition layer 400. For example, the spacers 700 may be sparsely distributed, such as one spacer 700 between adjacent pixels, and the width of each spacer 700 may be significantly less than the width of the pixel definition layer between pixels, such as less than a third of the width. The spacers 700 may protrude upwardly. The spacers 700 may include an organic material having a smaller modulus than the pixel definition layer 400. The spacers 700 may include, for example, one or more of an acryl-based resin and polyimide. For example, the spacers 700 may include acryl-based resin.

The spacers 700 may have a modulus that is smaller than that of the pixel definition layer 400. For example, the spacers 700 may have a modulus that is in a range of about 0.8 GPa to about 2.5 GPa. When the modulus of the spacers 700 is smaller than 0.8 GPa, it may be difficult for the spacers 700 to stably support a deposition mask in a deposition process, which will be described later. When the modulus of the spacers 700 is greater than 2.5 GPa, the spacers 700 may not compress properly in a substrate bonding process, which will be described later. Accordingly, it may be difficult to obtain a desired height t2 of the spacers 700 after the substrate bonding process. It should be noted that the OLED display 1000 in FIG. 1 is depicted after both the deposition process and the substrate bonding process.

The height t2 of the spacers 700 after the substrate bonding process may be in a range of about 0.3 μm to about 1 μm. When the height t2 of the spacers 700 after the substrate bonding process is smaller than 0.3 μm, it may be difficult to uniformly form the spacers 700 before the substrate bonding process, and thus the distance between the base substrate 100 and the encapsulation substrate 900 may be non-uniform. When the height t2 of the spacers 700 after the substrate bonding process is greater than 1 μm, an unnecessary space may exist between the pixel definition layer 400 and the encapsulation substrate 900, and thus more of the light emitted from the organic emission layer 500 may be absorbed by the black matrix 800, which may deteriorate light efficiency.

The second electrode 600 may be disposed (for example, formed) on the organic emission layer 500, the pixel definition layer 400, and the spacers 700, and may be commonly formed for a plurality of pixel areas. The second electrode 600 may be a cathode serving as an electron injection electrode, and may have light reflectivity, light transflectivity, or light transmissivity. For example, the second electrode 600 may include one or more metal oxides such as ITO, IZO, ZnO, and $In_2O_3$. Instead of or in addition to the metal oxides, the second electrode 600 may include one or more metals such as Ag, Mg, Al, Pt, Pd, Au, Ni, Nd, Ir, Cr, Li, Ca, Li, Ca, LiF/Ca, LiF/Al, and alloys thereof. Further, the second electrode 600 may be formed to have a single layer or a multi-layered structure in which a plurality of layers are stacked. In another embodiment, the second electrode 600 may be an anode serving as a hole injection electrode.

The encapsulation substrate 900 may be disposed on (for example, bonded to the base substrate 100 that includes) the first electrode 300, the organic emission layer 500, and the second electrode 600 to protect the first electrode 300, the organic emission layer 500, and the second electrode 600. The encapsulation substrate 900 may be an insulating substrate made of, for example, glass, quartz, ceramic, plastic, or the like. In other embodiments, the encapsulation substrate 900 may be a flexible, stretchable, or rollable substrate made of an organic material such as polyimide, polycarbonate, polyethylene, polyethylene terephthalate, or polyacrylate.

The black matrix 800 may be disposed (for example, formed) on a surface of the encapsulation substrate 900 that faces the base substrate 100 to correspond to the pixel definition layer 400 (and not disposed where the pixel definition layer may not be formed, such as the opening 410). The black matrix 800 may be disposed (for example, formed) on a surface of the encapsulation substrate 900 in a stripe or lattice pattern to improve contrast and coincide with the pixel definition layer 400. Light emitted from the organic emission layer 500 may transmit through one or more portions of the encapsulation substrate 900 at which the black matrix 800 is not disposed (such as portions corresponding to the openings 410).

When the organic emission layer 500 emits white light, one or more color filters for changing wavelengths of the light may be disposed (for example, formed or overlaid) at portions of the encapsulation substrate 900 (or other parts of the OLED display 1000) at which the black matrix 800 is not disposed. The black matrix 800 may have a structure in which a light absorption material is added into a resin matrix such as polyimide. Examples of the light absorption material may include carbon black, a polyene-based pigment, an azo-based pigment, an azomethine-based pigment, a diimmonium-based pigment, a phthalocyanine-based pigment, a quinone-based pigment, an indigo-based pigment, a thioindigo-based pigment, a dioxadin-based pigment, a quinacridone-based pigment, an isoindolinone-based pigment, a metal oxide, and a metal complex, as well as other aromatic hydrocarbons.

The black matrix 800 may have a modulus that is greater than that of the spacers 700. When the modulus of the black matrix 800 is the same or smaller than that of the spacers 700, the black matrix 800 may be damaged in a manufacturing process, such as a substrate-bonding process.

As described above, no unnecessary space may exist between the pixel definition layer 400 and the encapsulation substrate 900. Accordingly, all or most of the light emitted from the organic emission layer 500 may be prevented from being absorbed by the black matrix 800 and thus, the light emission efficiency may be prevented from deteriorating. Hereinafter, an example manufacturing method of an OLED display (such as the OLED display 1000 described above) will be described with reference to FIG. 2 to FIG. 5.

FIG. 2 to FIG. 5 are cross-sectional views illustrating an example manufacturing method of an OLED display 1000 according to an embodiment of the present invention.

Figure 2:
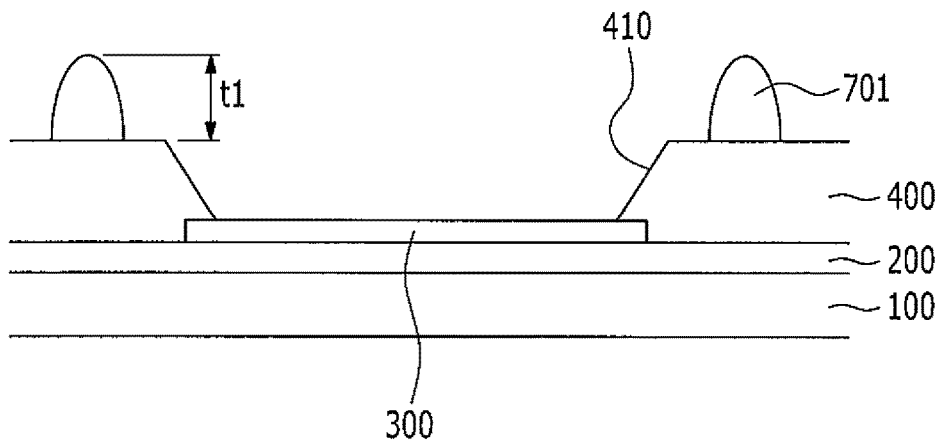
FIG. 2 to FIG. 5 are cross-sectional views illustrating an example manufacturing method of an OLED display according to an embodiment of the present invention.

As shown in FIG. 2, the circuit portion 200 and the first electrode 300 may be disposed (for example, formed) on the base substrate 100. For example, the circuit portion 200 may be disposed (for example, formed) on a base substrate 100 made of glass, quartz, ceramic, plastic, or the like. The pixel circuit (or circuit portion) 200 may include a plurality of pixel lines including at least one scan line, at least one data line, and at least one driving power line, two or more TFTs connected to the pixel lines to correspond to one pixel, and at least one capacitor. The circuit portion 200 may be formed to have various known structures to one of ordinary skill. The circuit portion 200 may be formed by using MEMS technology such as photolithography. The first electrode 300 may be disposed (for example, formed) on the circuit portion 200 and connected to one of the TFTs.

The pixel definition layer 400 may be disposed (for example, formed) on the base substrate 100. For example, the pixel definition layer 400 may include an opening 410 that exposes the first electrode 300 such that the pixel definition layer 400 is disposed (for example, formed) on the base substrate 100 to cover an end portion of the first electrode 300. The pixel definition layer 400 may be formed by coating an organic layer on the base substrate 100, performing exposure on the organic layer using a light transmitting mask, and developing the exposed organic layer to define the opening 410 that exposes a portion of the first electrode 300, but the present invention is not limited thereto. The organic layer may include, for example, polyimide (PI), benzocyclobutene (BCB), polyimide (PA), an epoxy resin, an acryl-based resin, or a phenol resin. For example, the organic layer may include polyimide.

Process spacers 701 (such as the spacers 700 described above, only before a substrate bonding process) may be disposed on the pixel definition layer 400. For example, the process spacers 701 may be formed by coating an organic material having a modulus that is smaller than that of the pixel definition layer 400 on the pixel definition layer 400, performing exposure using a light transmitting mask, and developing the exposed organic layer to remove remaining portions such that the process spacers 701 have an area that is smaller (for example, significantly smaller, such as one process spacer 701 between adjacent pixels, and occupying less than a third of the width of the pixel definition layer 400 between pixels) than that of the pixel definition layer 400, but the present invention is not limited thereto.

Examples of the organic material having a smaller modulus than that of the pixel definition layer 400 may include an acryl-based resin and polyimide. For example, an acryl-based resin may be employed. A height t1 of the process spacers 701 (or a height of the spacers 700 before the substrate bonding process) may be between about 3 μm and 10 μm to stably support a deposition mask and prevent damage to the pixel definition layer 400 from the mask when the organic emission layer 500 is deposited, while also being sufficiently small to compress to a desired height t2 after the substrate bonding process.

As illustrated in FIG. 2, the process spacers 701 may be disposed (for example, formed) at opposite ends of one opening 410 for convenience of description. However, the present invention is not limited to configurations in which the process spacers 701 are disposed for every pixel in an entire base substrate 100 including a plurality of pixels. For example, in other embodiments, two or more pixels may be disposed between adjacent ones of the process spacers 701, but still leave sufficient process spacers 701 to stably support the mask as would be apparent to one of ordinary skill. Accordingly, the number and locations of the process spacers 701 is not limited to the embodiment of FIG. 2.

Figure 3:
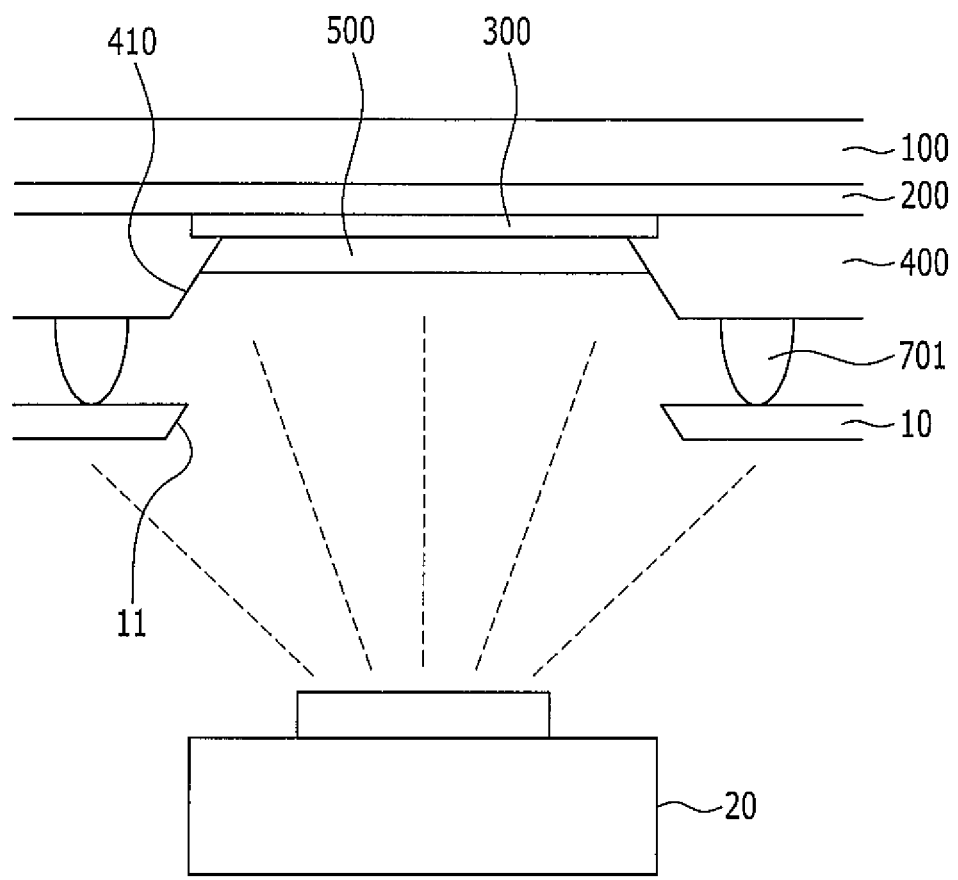

As shown in FIG. 3, the organic emission layer 500 may be disposed (for example, formed) on the first electrode 300. For example, a pattern mask 10 including an opening pattern 11 corresponding to the opening 410 may be brought into contact with the process spacers 701, and the organic emission layer 500 may be disposed (for example, formed) on the first electrode 300 through the opening pattern 11. The organic emission layer 500 may be formed by bringing the pattern mask 10 into contact with the process spacers 701 and vaporizing an organic emission material with a deposition source 20 toward the first electrode 300 through the opening pattern 11 of the pattern mask 10.

Figure 4:
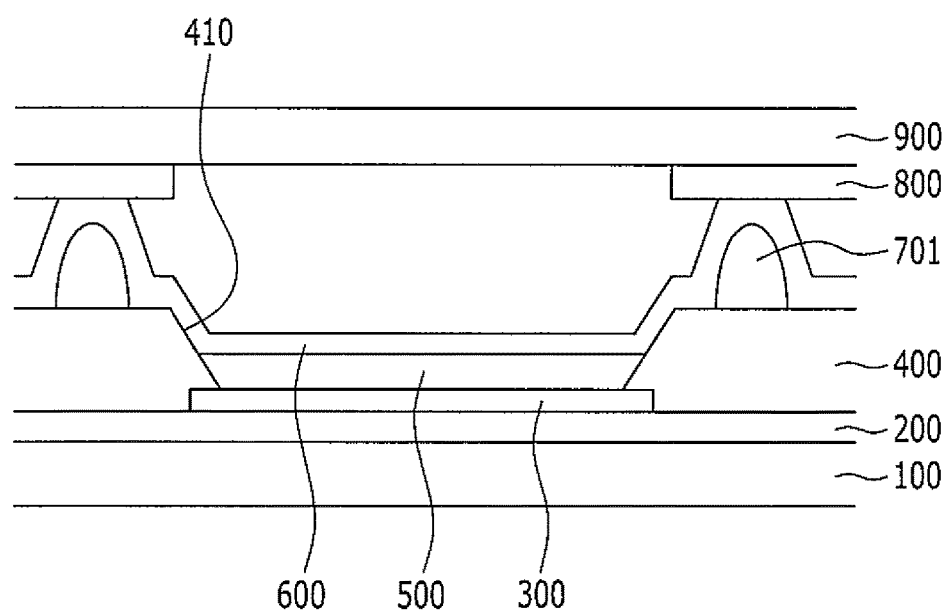

As shown in FIG. 4, the second electrode 600 may be disposed (for example, formed) on the organic emission layer 500. For example, throughout the base substrate 100 (e.g., for all of a plurality of pixels), the second electrode 600 may be disposed on the organic emission layer 500, the pixel definition layer 400, and the process spacers 701.

The encapsulation substrate 900 including the black matrix 800 may be disposed on (for example, put in contact with) the second electrode 600 (as elevated by the process spacers 701). For example, the black matrix 800 may be disposed (for example, formed) on a surface of the encapsulation substrate 900 to correspond to the pixel definition layer 400, and the encapsulation substrate 900 may be disposed (for example, put in contact with the second electrode 600) such that portions of the second electrode 600 disposed at an upper portion of the process spacers 701 contact the black matrix 800. A portion at which the black matrix 800 is not disposed corresponds to the opening 410.

Figure 5:
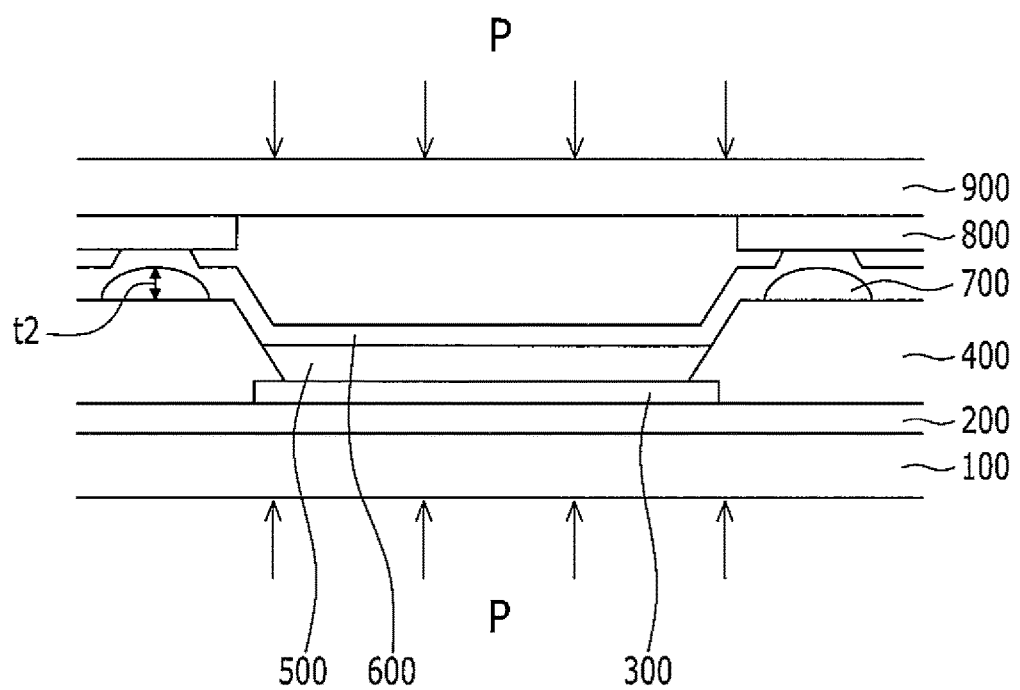

As shown in FIG. 5, the base substrate 100 and the encapsulation substrate 900 may be bonded (in a substrate bonding process) by applying pressure to outer surfaces of the base substrate 100 and the encapsulation substrate 900. For example, a pressure P may be applied such that the base substrate 100 and the encapsulation substrate 900 are bonded to each other by using an adhesive member coated on, e.g., an edge of the base substrate 100. Accordingly, the process spacers 701 may be compressed by the pressure P into the spacers 700 having a height t2 after the substrate bonding process that is lower than a height t1 of the process spacers 701 before the substrate bonding process.

The process spacers 701 may have a modulus that is smaller than those of the pixel definition layer 400 and the black matrix 800 and thus, the process spacers 701 before the substrate bonding process may be changed into the spacers 700 after the substrate bonding process having the smaller height without damage to the pixel definition layer 400 and the black matrix 800. The height t2 of the spacers 700 after the substrate bonding process may be reduced by about 65% to about 90% of the height t1 of the process spacers 701 before the substrate bonding process.

In other words, the height t2 of the spacers 700 after the substrate bonding process may be about 10% to about 35% of the height t1 of the process spacers 701 before the substrate bonding process. For example, the height t2 of the spacers 700 after the substrate bonding process may be in a range of about 0.3 μm to about 1 μm. Further, the pressure P applied in the bonding may be in a range of about 100,325 Pa to about 101,325 Pa. A pressurizing process for the bonding may be performed by using a vacuum chamber, and an external force may be applied to the encapsulation substrate 900, but the present invention is not limited thereto.

Portions of the second electrode 600 disposed at the upper portion of the process spacers 701 may be damaged by the pressure process so that the spacers 700 and the black matrix 800 directly contact each other. However, because the spacers 700 are distributed relatively sparsely, a ratio of the damaged portion of the second electrode 600 to an entire area of second electrode 600 formed throughout the base substrate 100 may be relatively small, such that driving of the OLED display is hardly affected.

In summary, the modulus of the process spacers 701 formed to support the pattern mask 10 in the deposition of the organic emission layer 500 may be smaller than those of the pixel definition layer 400 and the black matrix 800. The spacers 700 may be formed to have an appropriate height for preventing damage to the pixel definition layer 400 and the black matrix 800 without adding additional process steps. Accordingly, it may be possible to block a loss of light emitted from the organic emission layer 500 toward the black matrix 800 that is caused by an unnecessary space formed due to the process spacers 701 remaining in the OLED display 1000 even after the manufacturing process is completed.

While the present invention has been described in connection with what is considered to be practical embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME SYMBOLS

100: base substrate
200: circuit portion
300: first electrode
400: pixel definition layer
500: organic emission layer
600: second electrode
700: spacers
701: process spacers
800: black matrix
900: encapsulation substrate

410: opening
t1: spacer height before substrate bonding
t2: spacer height after substrate bonding

What is claimed is:

1. An organic light emitting diode (OLED) display comprising:
   a base substrate;
   a first electrode on the base substrate;
   a pixel definition layer on the first electrode and having an opening exposing the first electrode;
   spacers on the pixel definition layer and having a smaller modulus than the pixel definition layer, adjacent ones of the spacers being located at opposite sides of the opening with an open space therebetween;
   an organic emission layer on the first electrode to correspond to the opening; and
   a second electrode on the organic emission layer,
   wherein the spacers are between the pixel definition layer and the second electrode.

2. The OLED display of claim 1, wherein the spacers have a height of about 0.3 μm to about 1 μm.

3. The OLEO display of claim 1, wherein the spacers have a modulus of about 0.8 GPa to about 2.5 GPa.

4. The OLED display of claim 1, wherein the spacers comprise one of an acryl-based resin and polyimide.

5. The OLED display of claim 1, further comprising:
   an encapsulation substrate on the second electrode and having a surface facing the base substrate; and
   black matrix on the surface of the encapsulation substrate to correspond to the pixel definition layer.

6. The OLED display of claim 5, wherein the black matrix has a larger modulus than the spacers.

\* \* \* \* \*